(12) United States Patent
Murata et al.

(10) Patent No.: US 9,059,128 B2
(45) Date of Patent: Jun. 16, 2015

(54) SEMICONDUCTOR DEVICE HAVING IMPROVED THERMAL PROPERTIES

(71) Applicants: Daisuke Murata, Tokyo (JP); Masao Kikuchi, Tokyo (JP)

(72) Inventors: Daisuke Murata, Tokyo (JP); Masao Kikuchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 76 days.

(21) Appl. No.: 13/742,079

(22) Filed: Jan. 15, 2013

(65) Prior Publication Data
US 2013/0285235 A1 Oct. 31, 2013

(30) Foreign Application Priority Data
Apr. 27, 2012 (JP) ................................. 2012-103244

(51) Int. Cl.
*H01L 23/373* (2006.01)
*H01L 23/16* (2006.01)
*H01L 23/433* (2006.01)
(Continued)

(52) U.S. Cl.
CPC ..... *H01L 23/373* (2013.01); *H01L 2224/48091* (2013.01); *H01L 2224/73265* (2013.01); *H01L 2224/40137* (2013.01); *H01L 2224/40139* (2013.01); *H01L 23/16* (2013.01); *H01L 23/3121* (2013.01); *H01L 24/29* (2013.01); *H01L 24/32* (2013.01); *H01L 24/33* (2013.01); *H01L 24/40* (2013.01); *H01L 24/48* (2013.01); *H01L 24/73* (2013.01); *H01L 2224/04042* (2013.01); *H01L 2224/291* (2013.01); *H01L 2224/2919* (2013.01); *H01L 2224/32245* (2013.01); *H01L 2224/33181* (2013.01); *H01L 2224/48247* (2013.01); *H01L 2224/73215* (2013.01); *H01L 2224/73221* (2013.01); *H01L 2224/73263* (2013.01); *H01L 2924/1203* (2013.01); *H01L 2924/13055* (2013.01); *H01L 2924/3511* (2013.01); *H01L 2224/40247* (2013.01);
(Continued)

(58) Field of Classification Search
CPC ............... H01L 2224/73265; H01L 14/32245; H01L 2224/48247; H01L 2924/00012; H01L 2924/13055; H01L 2924/00
USPC ............ 257/712, 77, 675, E25.016, E29.084, 257/E21.705, 73, 717, 720, 707, 710, 704, 257/703, 706
See application file for complete search history.

(56) References Cited

U.S. PATENT DOCUMENTS

2004/0089928 A1    5/2004  Nakajima et al.
2011/0291106 A1*  12/2011  Kikuchi .......................... 257/77
(Continued)

FOREIGN PATENT DOCUMENTS

JP        06-216277 A     8/1994
JP        10-275887 A    10/1998
(Continued)

*Primary Examiner* — Alexander Oscar Williams
(74) *Attorney, Agent, or Firm* — Studebaker & Brackett PC

(57) ABSTRACT

A semiconductor device includes: a first heat spreader; a second heat spreader separated from the first heat spreader; a first semiconductor element on the first heat spreader and having a back face jointed to the first heat spreader; a second semiconductor element on the second heat spreader and having a back face jointed to the second heat spreader; a resin coating the first and second heat spreaders and the first and second semiconductor elements; and a reinforcing member provided across a region between the first and second heat spreaders in the resin, and having rigidity higher than rigidity of the resin.

5 Claims, 4 Drawing Sheets

(51) Int. Cl.
*H01L 23/31* (2006.01)
*H01L 23/00* (2006.01)

(52) U.S. Cl.
CPC ......... *H01L23/3735* (2013.01); *H01L 23/4334* (2013.01); *H01L 2924/1305* (2013.01)

(56) References Cited

U.S. PATENT DOCUMENTS

2012/0138946 A1* 6/2012 Kikuchi et al. ................. 257/76
2013/0015468 A1* 1/2013 Kikuchi ........................... 257/77
2013/0181228 A1* 7/2013 Usui et al. ....................... 257/77

FOREIGN PATENT DOCUMENTS

| JP | 2004-165281 | A |   | 6/2004 |
|----|-------------|---|---|--------|
| JP | 2005-285877 | A |   | 10/2005 |
| JP | 2006-216776 | A |   | 8/2006 |
| JP | 2008-021033 | A |   | 1/2008 |
| JP | 2011-249364 | A | * | 5/2010 |
| JP | 2011-253862 | A | * | 12/2011 |

* cited by examiner

SEMICONDUCTOR DEVICE HAVING IMPROVED THERMAL PROPERTIES

BACKGROUND OF THE INVENTION

1. Field of the Invention

The present invention relates to a semiconductor device used in an inverter to control a motor used in automobiles or electric trains, or in a converter for electric generation or regeneration.

2. Background Art

A semiconductor device wherein a semiconductor element is mounted on a heat spreader, and the heat spreader and the semiconductor element are sealed with a resin has been used (for example, refer to Japanese Patent Application Laid-Open No. 2004-165281).

SUMMARY OF THE INVENTION

In a semiconductor device wherein each of semiconductor elements is mounted on two heat spreaders separated from each other, a resin is present in the region between the two heat spreaders. Due to the difference in the linear expansion coefficients between the resin and the heat spreader, when heat is generated and temperature change occurs during the use, thermal stress occurs. For this reason, when excessive hot-cold cycles are applied, a warpage occurs from the region between the two heat spreaders. Further, there has been a problem wherein abrasion develops between the resin and internal members such as the heat spreader or lead frames, and reliability is affected.

In view of the above-described problems, an object of the present invention is to provide a semiconductor device which can inhibit the warpage by thermal stress and improve the reliability.

According to the present invention, a semiconductor device includes: a first heat spreader; a second heat spreader separated from the first heat spreader; a first semiconductor element on the first heat spreader and having a back face jointed to the first heat spreader; a second semiconductor element on the second heat spreader and having a back face jointed to the second heat spreader; a resin coating the first and second heat spreaders and the first and second semiconductor elements; and a reinforcing member provided across a region between the first and second heat spreaders in the resin, and having rigidity higher than rigidity of the resin.

The present invention makes it possible to inhibit the warpage by thermal stress and improve the reliability.

Other and further objects, features and advantages of the invention will appear more fully from the following description.

DETAILED DESCRIPTION OF THE PREFERRED EMBODIMENTS

A semiconductor device according to the embodiments of the present invention will be described with reference to the drawings. The same components will be denoted by the same symbols, and the repeated description thereof may be omitted.

First Embodiment

Figure 1:
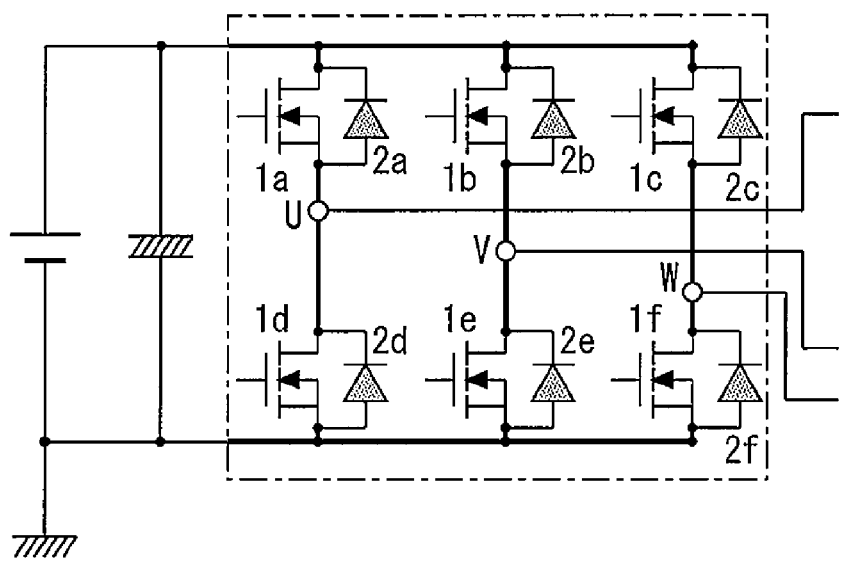
FIG. 1 is a circuit diagram showing a semiconductor device according to the first embodiment of the present invention.

FIG. 1 is a circuit diagram showing a semiconductor device according to the first embodiment of the present invention. Six pairs of transistor elements 1a to 1f and diodes 2a to 2f constitute a three-phase half-bridge circuit. An electric power from a power source is supplied to the load via U, V, and W terminals. The transistor elements 1a to 1f are insulated gate bipolar transistors (IGBT) which conduct electric currents supplied from the power source for only required times. The diodes 2a to 2f reflux electric current when the transistor elements 1a to 1f become the blocking state from the conducting state.

Figure 2:
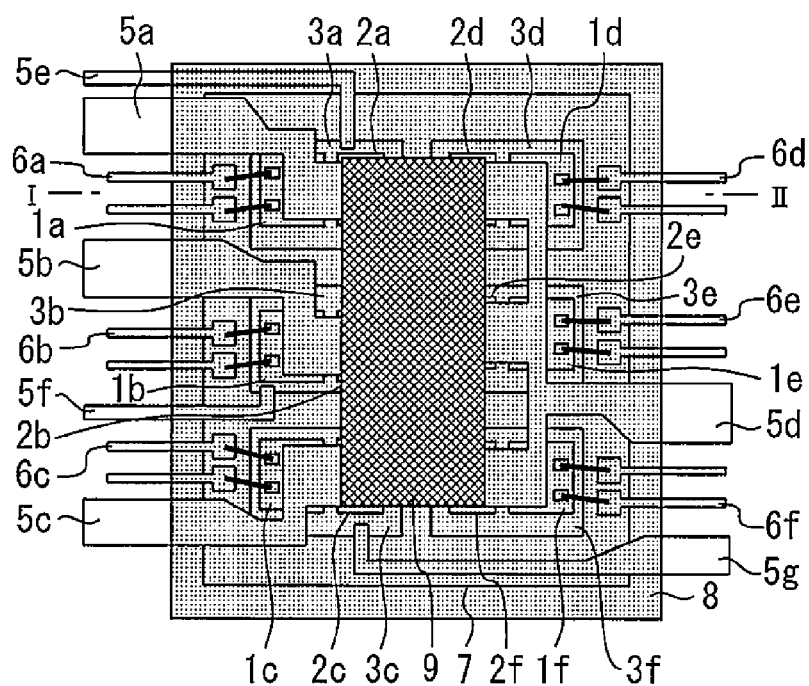
FIG. 2 is a perspective top view showing the interior of the semiconductor device according to the first embodiment of the present invention.
Figure 3:
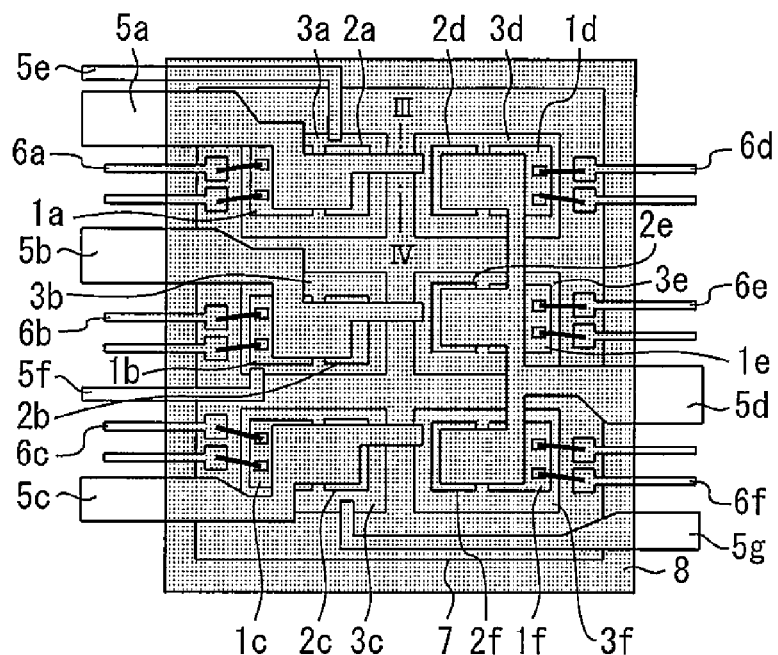
FIG. 3 is a perspective top view showing the interior of the semiconductor device (from which reinforcing members are omitted) according to the first embodiment of the present invention.
Figure 4:
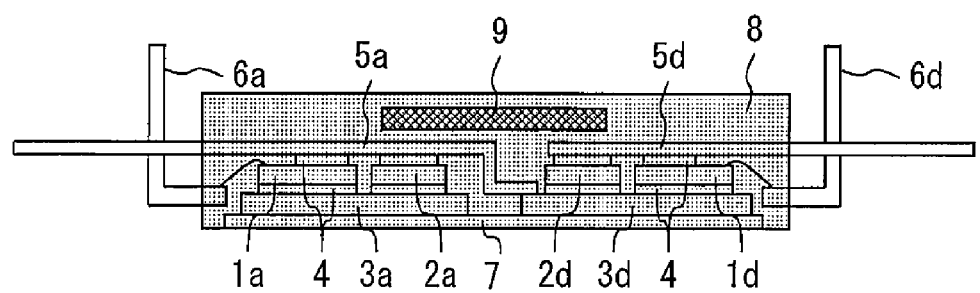
FIG. 4 is a sectional view taken along the line I to II in FIG. 2.

FIG. 2 is a perspective top view showing the interior of the semiconductor device according to the first embodiment of the present invention. FIG. 3 is a perspective top view showing the interior of the semiconductor device (from which reinforcing members are omitted) according to the first embodiment of the present invention. FIG. 4 is a sectional view taken along the line I to II in FIG. 2.

Heat spreaders 3a to 3c and heat spreaders 3d to 3f are separately arranged on the left and the right. The heat spreaders 3a to 3f are separated from each other. The transistor elements 1a to 1c and the diodes 2a to 2c are respectively mounted on the heat spreaders 3a to 3c, and the back faces thereof are separately joined to the heat spreaders 3a to 3c with a solder 4. The transistor elements 1d to 1f and the diodes 2d to 2f are respectively mounted on the heat spreaders 3d to 3f, and the back faces thereof are separately joined to the heat spreaders 3d to 3f with the solder 4.

Wiring members 5a to 5c separated from each other are respectively joined to the upper faces of the transistor elements 1a to 1c and the diodes 2a to 2c with the solder 4. A wiring member 5d is joined on the upper faces of the transistor elements 1d to 1f and the diodes 2d to 2f with the solder 4 in common. In place of the solder 4, a conductive adhesive or the like can also be used. The wiring members 5a to 5c are respectively joined to the peripheral portions on the upper faces of the heat spreaders 3d to 3f. Wiring members 5e to 5g separated from each other are respectively joined to the peripheral portions on the upper faces of the heat spreaders 3a to 3c.

Signal wirings 6a to 6c are respectively connected by wires to the control terminals of the transistor elements 1a to 1c. Signal wirings 6d to 6f are respectively connected by wires to the control terminals of the transistor elements 1d to 1f. For insulation from the exterior, an insulating layer 7 is provided on the back face of the heat spreaders 3d to 3f. These heat spreaders 3a to 3f, the transistor elements 1a to 1f, the diodes 2a to 2f, parts of the wiring members 5a to 5g, parts of the signal wirings 6a to 6f, and the upper faces and the side faces of the insulating layer 7 are coated with a molding resin 8.

The wiring members 5a to 5g assume receiving and sending the electric power from and to the exterior of the device. The wiring members 5a to 5g and the signal wirings 6a to 6f are formed in the state wherein, for example, the identical metal plates are punched or etched to be integrally connected at the outer frame. Parts of them are coated with the molding resin 8 to mechanically hold them, and the outer frame is removed to divide the wiring members 5a to 5g and the signal wirings 6a to 6f. Thereby, since a large number of wiring members 5a to 5g and signal wirings 6a to 6f can be assembled at once, the productivity is improved, and the industrial value is elevated.

In the present embodiment, a reinforcing member 9 having the rigidity higher than the rigidity of the molding resin 8 is provided across the region between heat spreaders 3a to 3f in the molding resin 8. The reinforcing member 9 is provided above the transistor elements 1a to 1f and the diodes 2a to 2f without contacting to the transistor elements 1a to 1f and the diodes 2a to 2f.

The reinforcing member 9 is, for example, a metallic plate member. If the reinforcing member 9 is a metallic member, it has a sufficiently higher Young's modulus than the molding resin 8. Therefore, the reinforcing effect can be improved. In addition, when the reinforcing member 9 is fabricated with organic materials reinforced like fiber-reinforced plastics, ceramic materials, or the like, it is preferred for weight saving. Further, the reinforcing member 9 is not limited to a plate shape, but can have an L- or U-shape so as to inhibit bending.

By reinforcing the region between the heat spreaders 3a to 3f with the reinforcing member 9, the warpage caused by thermal stress can be inhibited in such a region. As a result, breakage can be prevented and reliability can be improved.

In addition, the transistor elements 1a to 1f, the diodes 2a to 2f, the heat spreaders 3a to 3f, the wiring members 5a to 5g, and the signal wirings 6a to 6f constitute a three-phase half bridge circuit required in the inverter circuit for controlling the load of the motor or the like. As described above, in the case where a three-phase half bridge circuit is constituted with one semiconductor device, the package size is enlarged, and the problem of warpage becomes significant. However, since warpage can be inhibited by the constitution of the present embodiment, the reliability can be improved.

Further, the wiring members 5a to 5c intersect the region between the heat spreaders 3a to 3c and the heat spreaders 3d to 3f to connect the upper faces of the transistor elements 1a to 1c and the heat spreaders 3d to 3f, respectively. With functioning as electric circuits, the wiring members 5a to 5c can reinforce the relevant region. Therefore, without increasing the number of parts, the warpage by thermal stress can be inhibited. As a result, the reliability can be improved without impairing productivity.

Figure 5:
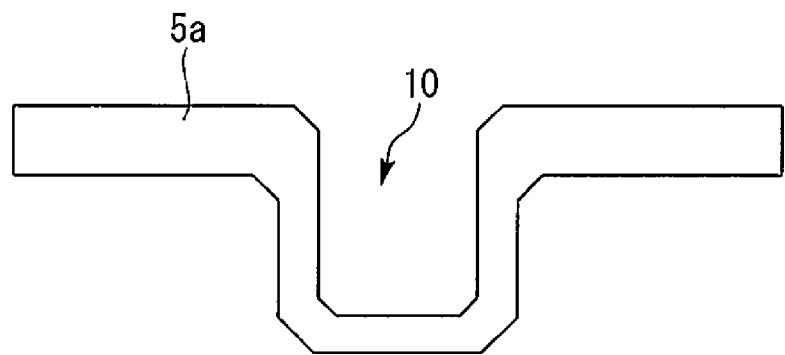
FIG. 5 is a sectional view taken along the line III-IV in FIG. 3.

FIG. 5 is a sectional view taken along the line III-IV in FIG. 3. Even if the wiring members 5a to 5c have a flat structure, reinforcing effects can be obtained due to the rigidity of the metal. However, by providing a U-shaped indent 10 in parts of the wiring members 5a to 5c in the direction from the upper face to the back face, the rigidity in the thickness direction can be improved. If the depth of the indent 10 is about 1.5 times the thickness of the wiring members 5a to 5c, processing can be performed, and a sufficient reinforcing effect can be obtained. Further, the indent 10 can be provided in the direction from the back face to the upper face of the wiring members 5a to 5c. The shape of the indent 10 is not required to be U-shaped, but can be triangular or semicircular.

Figure 6:
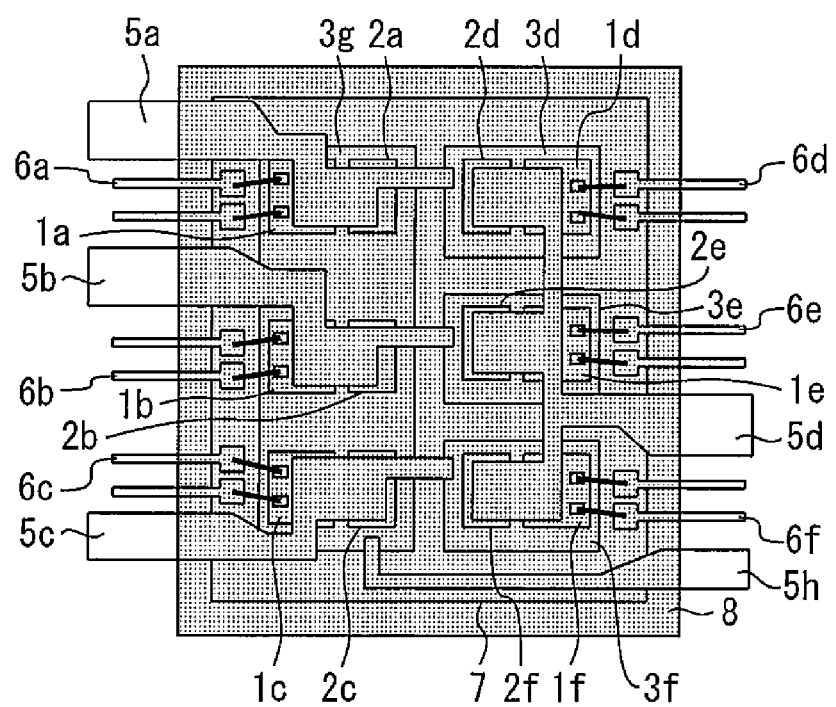
FIG. 6 is a perspective top view showing the interior of a semiconductor device in a modification example (from which reinforcing members are omitted) according to the first embodiment of the present invention.

FIG. 6 is a perspective top view showing the interior of a semiconductor device in a modification example (from which reinforcing members are omitted) according to the first embodiment of the present invention. The transistor elements 1a to 1c and the diodes 2a to 2c are mounted on one heat spreader 3g in parallel and the back faces thereof are commonly joined to the heat spreader 3a with the solder 4. Thereby, the left side of the device is supported by the heat spreader 3g having a high rigidity. A wiring member 5h is joined to the peripheral portion of the upper face of the heat spreader 3g.

As described above, the heat spreaders 3a to 3c having the same potential are gathered to one heat spreader 3g, and the warpage of the package in the longitudinal direction of the heat spreader 3g can be reduced. In addition, the number of the parts can be reduced, and the assembly can be simplified. Furthermore, it is preferable that the longitudinal direction of the heat spreader 3g is parallel to the terminal takeout face of the package because wiring is easy. However, the vertical direction to the terminal takeout face is also feasible.

Second Embodiment

Figure 7:
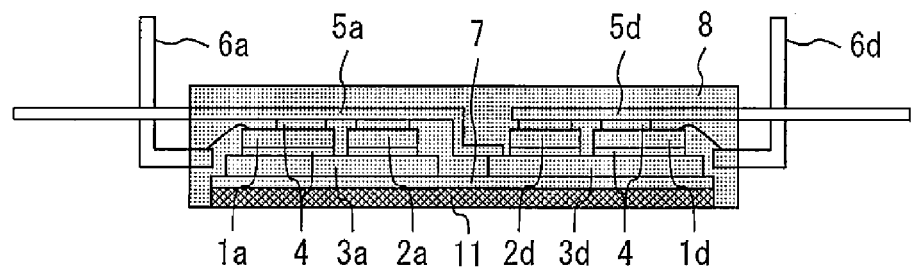
FIG. 7 is a sectional view showing a semiconductor device according to the second embodiment of the present invention.

FIG. 7 is a sectional view showing a semiconductor device according to the second embodiment of the present invention. Since insulation between elements is ensured under the insulating layer 7, a copper foil 11 is provided under the insulating layer 7 across a plurality of heat spreaders 3a to 3f. The copper foil 11 is thicker than the insulating layer 7, and intersects the region between the heat spreaders 3a to 3f. By reinforcing the region between the heat spreaders 3a and 3f with the thickened copper foil 11, the warpage caused by thermal stress in the region can be inhibited. As a result, breakage can be prevented and reliability can be improved. In addition, the copper foil 11 can also be used as the adhesion of the package and the cooler.

Third Embodiment

Figure 8:
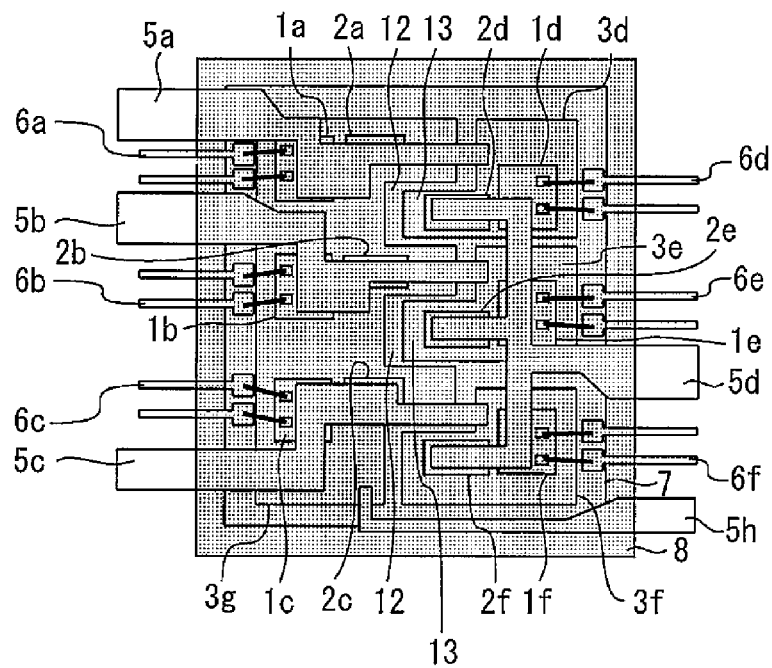
FIG. 8 is a perspective top view showing the interior of a semiconductor device according to the third embodiment of the present invention.

FIG. 8 is a perspective top view showing the interior of a semiconductor device according to the third embodiment of the present invention. The heat spreader 3g has a concave portion 12 facing the heat spreaders 3d to 3f. The heat spreaders 3d to 3f have extended portion 13 entering into the concave portion 12. Thereby, the region between the heat spreader 3g and the heat spreaders 3d to 3f are reinforced, and warpage caused by thermal stress in the region can be inhibited. As a result, breakage can be prevented, and reliability can be improved. In addition, although the shape of the extended portion 13 is preferably rectangular along the shape of the semiconductor element, it can be curved like an S-line, or can be triangular.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2012-103244, filed on Apr. 27, 2012 including specification, claims, drawings and summary, on which the Convention priority of the present application is based, are incorporated herein by reference in its entirety.

What is claimed is:

1. A semiconductor device comprising:
   a first heat spreader;
   a second heat spreader separated from the first heat spreader;
   a first semiconductor element on the first heat spreader and having a back face jointed to the first heat spreader;
   a second semiconductor element on the second heat spreader and having a back face jointed to the second heat spreader;

a resin coating the first and second heat spreaders and the first and second semiconductor elements; and a reinforcing member provided across a region between the first and second heat spreaders in the resin, the reinforcing member making direct contact only with the resin and having rigidity higher than rigidity of the resin.

2. The semiconductor device according to claim 1, wherein the reinforcing member is provided above the first and second semiconductor elements without contacting to the first and second semiconductor elements.

3. The semiconductor device according to claim 1, further comprising a wiring member connecting an upper face of the first semiconductor element to the second heat spreader and having an indent.

4. The semiconductor device according to claim 1, wherein the first semiconductor element includes a plurality of semiconductor elements, and back faces of the plurality of semiconductor elements are commonly joined to the first heat spreader.

5. The semiconductor device according to claim 1, wherein the first and second heat spreaders and the first and second semiconductor elements constitute a three-phase half-bridge circuit.

\* \* \* \* \*